(12) United States Patent
Chen et al.

(10) Patent No.: US 7,390,230 B1
(45) Date of Patent: Jun. 24, 2008

(54) COMBINATIONAL JUMPER WIRE HOLDER

(75) Inventors: Wen-Sheng Chen, Taipei (TW);
Chang-Kuo Chang, Taipei County (TW)

(73) Assignee: Lite-On Technology Corp., Neihu, Taipei (TW)

( * ) Notice: Subject to any disclaimer, the term of this patent is extended or adjusted under 35 U.S.C. 154(b) by 0 days.

(21) Appl. No.: 11/734,258

(22) Filed: Apr. 11, 2007

(51) Int. Cl.
*H01R 4/02* (2006.01)
(52) U.S. Cl. .................................................... 439/875
(58) Field of Classification Search ................ 439/875, 439/876, 501, 110, 752, 677, 137
See application file for complete search history.

(56) References Cited

U.S. PATENT DOCUMENTS

| | | | |
|---|---|---|---|
| 3,316,520 A * | 4/1967 | Hamilton | 439/44 |
| 3,378,808 A * | 4/1968 | French | 439/492 |
| 3,963,319 A * | 6/1976 | Schumacher et al. | 439/439 |
| 6,249,636 B1 * | 6/2001 | Daoud | 385/137 |
| 6,343,942 B1 * | 2/2002 | Okamoto | 439/110 |
| 6,428,349 B1 * | 8/2002 | Dickson et al. | 439/513 |
| 6,666,713 B1 * | 12/2003 | Norvelle | 439/507 |
| 6,932,639 B2 * | 8/2005 | Woodruff | 439/403 |
| 7,306,480 B2 * | 12/2007 | Shi et al. | 439/501 |

* cited by examiner

*Primary Examiner*—Chandrika Prasad
(74) *Attorney, Agent, or Firm*—Winston Hsu

(57) ABSTRACT

A jumper wire is fixed on a groove of a jumper wire holder when the first end of the jumper wire passes through a first holding hole of the jumper wire holder and the second end passes through a second holding hole of the jumper wire holder. The two positioning pins at the ends of the jumper wire holder allow the jumper wire holder for being easily installed on the PCB. The reflowing welding is available to weld the jumper wire on the jumper wire holder with the circuit on the PCB. The connectors at the ends of the jumper wire holder allow the jumper wire holder to combine in series, providing the jumper wire holder for holding longer jumper wire.

10 Claims, 8 Drawing Sheets

COMBINATIONAL JUMPER WIRE HOLDER

BACKGROUND OF THE INVENTION

1. Field of the Invention

The present invention relates to a jumper wire holder, and more specifically, to a combinational jumper wire holder.

2. Description of the Prior Art

Computer, communication, and consuming electronics have been the fastest grown industries worldwide. In these industries, the printed circuit board or the printed wiring board (abbreviated as PCB or PWB) is practically the most important component which provides the main supporter for installing various electronic elements. The PCB (PWB) serves to connect each electronic elements to form an integral electronic assembly and make the electronic elements function well.

With the multifunctional, miniaturizing advancement of the electronic products, the PCB must provide more functions than ever. In a low-cost single layer PCB, since the deployment of the signal wires and the power wires is not as easy as in multi-layer PCB, the prior art single layer PCB utilizes jumper wires to unlock the deployment limitation besides using thin wires in deployment.

Please refer to FIG. 1 FIG. 1 is an illustration of a prior art jumper wire 20 installed on a PCB 10. The PCB 10 has a first circuit end 11 and a second circuit end 12 and the prior art jumper wire 20 is for coupling the first circuit end 11 and the second circuit end 12 by its first end 21 and the second end 22 to connect the circuit. FIG. 2 is an illustration of the prior art jumper wire 20 striding across other circuit (an electronic element 15 in FIG. 2). However, the jumper wire 20 of a prior art PCB 10 is wrapped with heat-shrinkable plastic tube for insulation. Its non-rigid structure is prone to deform or tilt (or even crack at the contacts) during the assembly procedure, probably caused by accidental manual force in the direction F or N in FIG. 2. The deformation or tilt for a high voltage jumper wire 20 is a main cause of spark-over. On the other hand, it takes a lot of effort for an operator to position and weld the two ends of the prior art jumper wire 20 on each circuit ends of the PCB 10.

SUMMARY OF THE INVENTION

The claimed invention provides an electronic device having a combinational jumper wire holder. The electronic device comprises a printed circuit board (PCB), a jumper wire, and a jumper wire holder. The PCB comprises a first position hole, a second position hole, a first circuit end, and a second circuit end. The jumper wire has a first end coupled with the first circuit end and a second end coupled with the second circuit end. The jumper wire holder is installed on the PCB and comprises a plurality of position pins, a groove, a plurality of holding holes, and a plurality of guiders. The plurality of position pins are disposed at the ends of the jumper wire holder for plugging into the first position hole and the second position hole. The jumper wire is fixed on the jumper wire holder along the groove. The first end and the second end of the jumper wire pass through one of the plurality of holding holes respectively for fixing the jumper wire in the groove. The plurality of guiders are disposed at the ends of the jumper wire holder. The first end and the second end of the jumper wire pass through one of the plurality of guiders and are coupled with the first circuit end and the second circuit end respectively.

The claimed invention also provides a combinational jumper wire holder installed on a printed circuit board (PCB). The PCB comprises a first circuit end, a second circuit, and a jumper wire. The jumper wire is coupled with the first circuit end and the second circuit end. The combinational jumper wire comprises a plurality of position pins, a groove, a plurality of holding holes, and a plurality of guiders. The plurality of position pins are disposed at the ends of the jumper wire holder for plugging into the position holes on the PCB. The jumper wire is fixed on the jumper wire holder along the groove. The ends of the jumper wire pass through one of the plurality of holding holes respectively for fixing the jumper wire in the groove. The plurality of guiders are disposed at the ends of the jumper wire holder. The ends of the jumper wire pass through one of the plurality of guiders and are coupled with the first circuit end and the second circuit end respectively.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
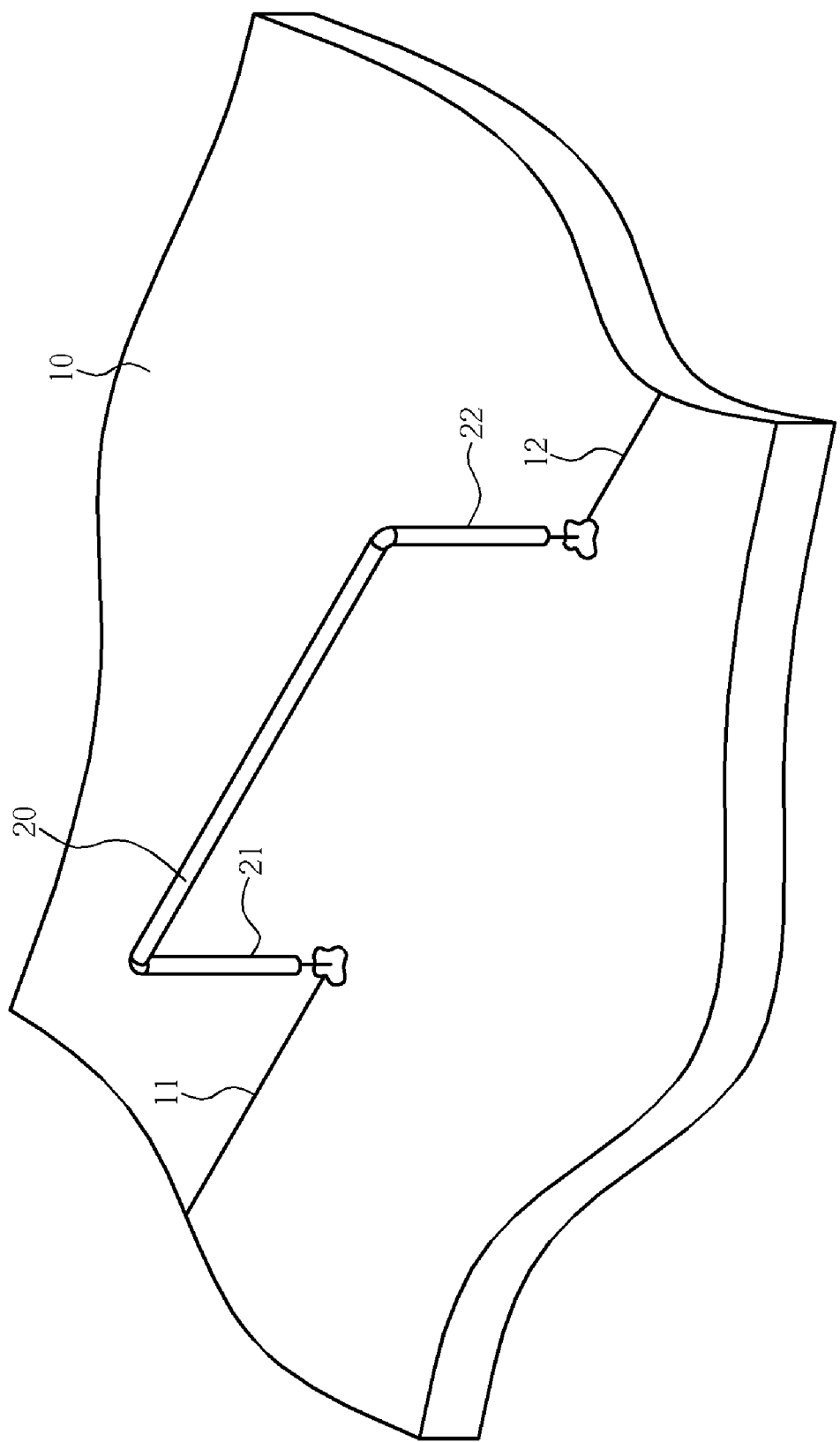
FIG. 1 is an illustration of a prior art jumper wire installed on a PCB.
Figure 2:
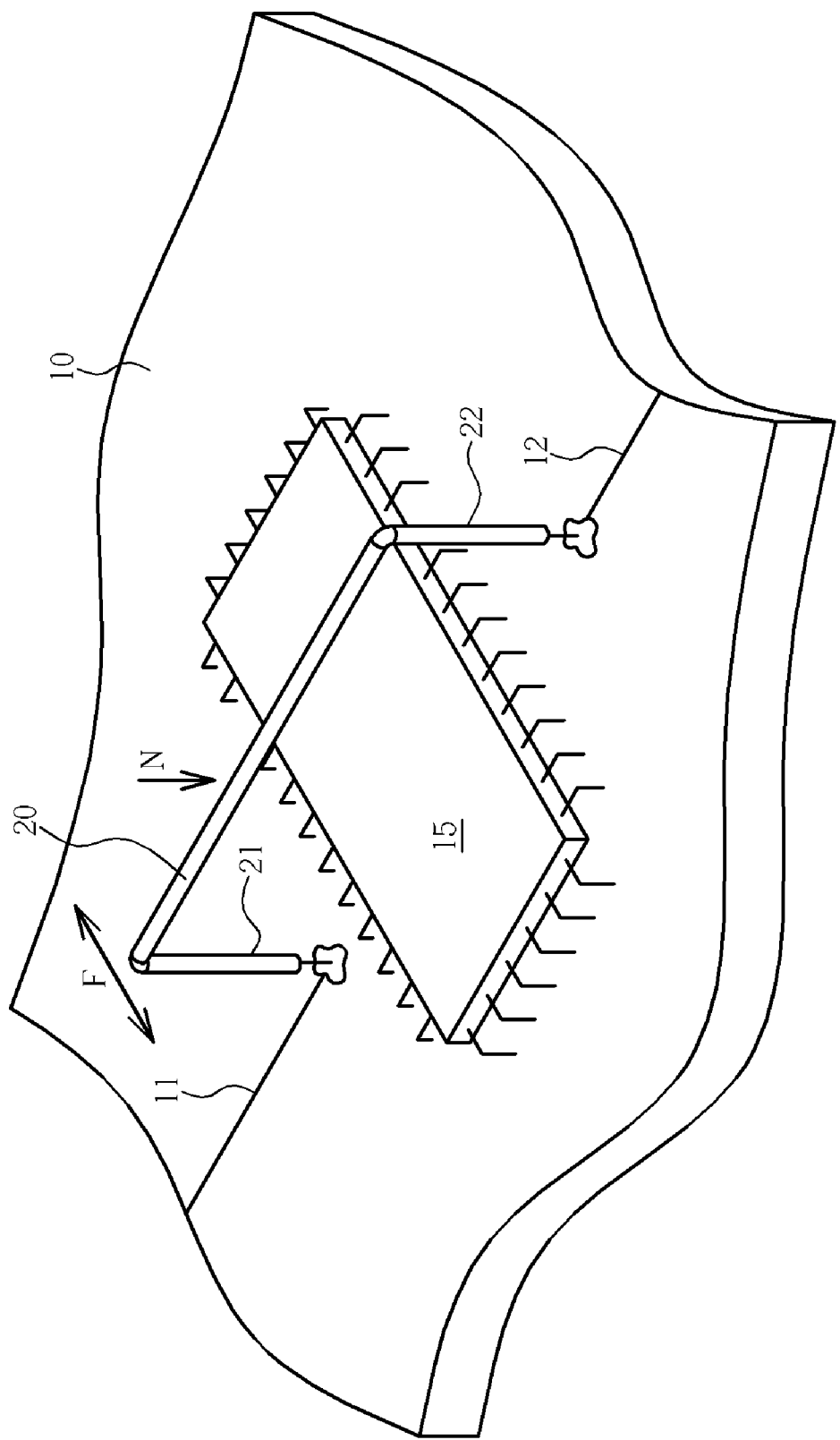
FIG. 2 is an illustration of the prior art jumper wire striding across other circuit.
Figure 3:
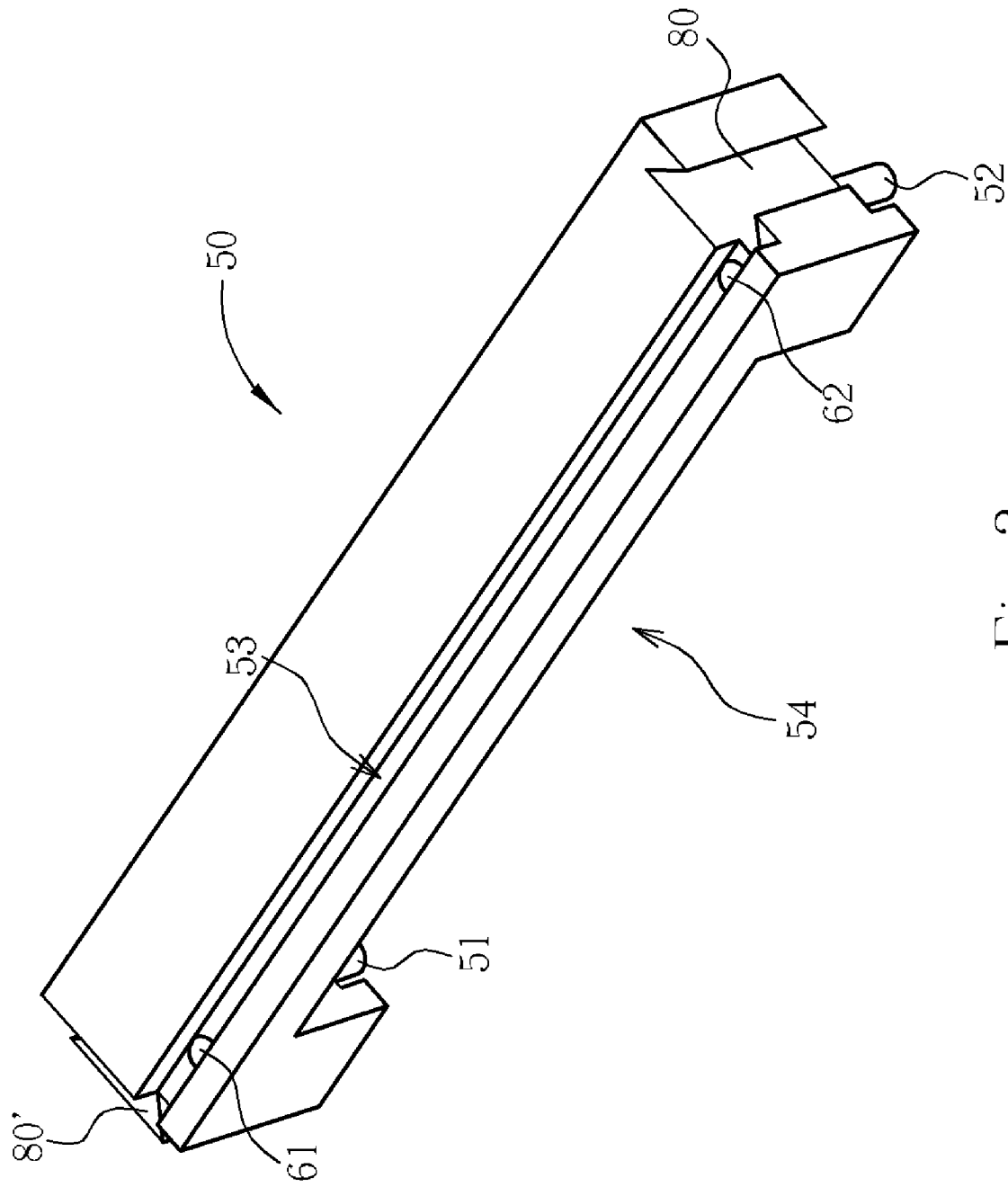
FIG. 3 is an illustration of a first exemplary embodiment of a jumper wire holder according to the present invention.
Figure 4:
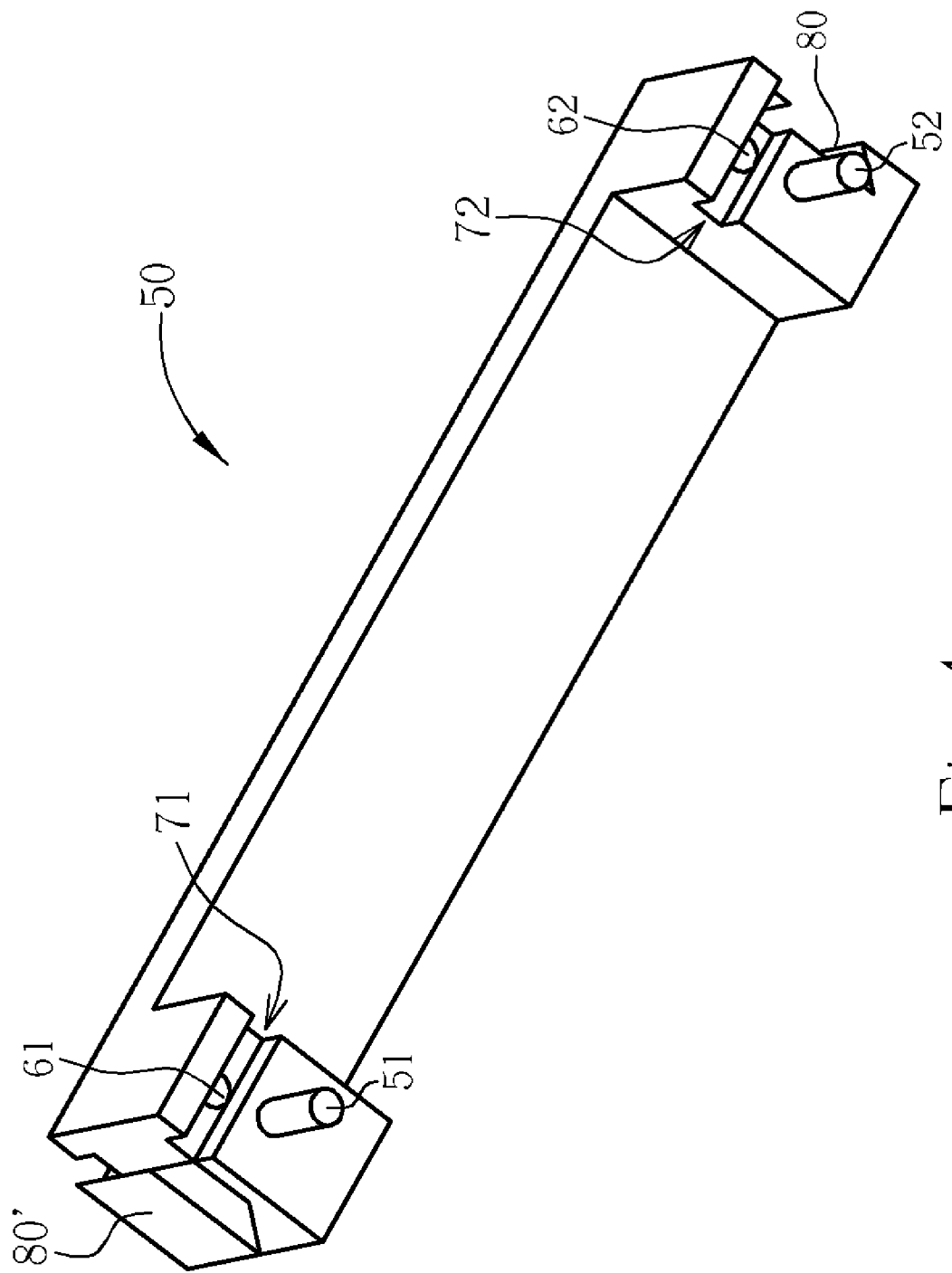
FIG. 4 is an illustration of a bottom perspective view of the first exemplary embodiment of the jumper wire holder.

Please refer to FIG. 3. FIG. 3 is an illustration of a first exemplary embodiment of a jumper wire holder 50 according to the present invention. The jumper wire holder 50 comprises a groove 53, a plurality of position pins 51,52, a plurality of holding holes 61,62, a plurality of guiders 71,72, a span bridge 54, and the connectors 80,80' in which the plurality of position pins 51,52, the plurality of guiders 71,72, and the connectors 80,80' are disposed at the two ends of the jumper wire holder 50 respectively. FIG. 4 is an illustration of a bottom perspective view of the jumper wire holder 50.

Figure 5:
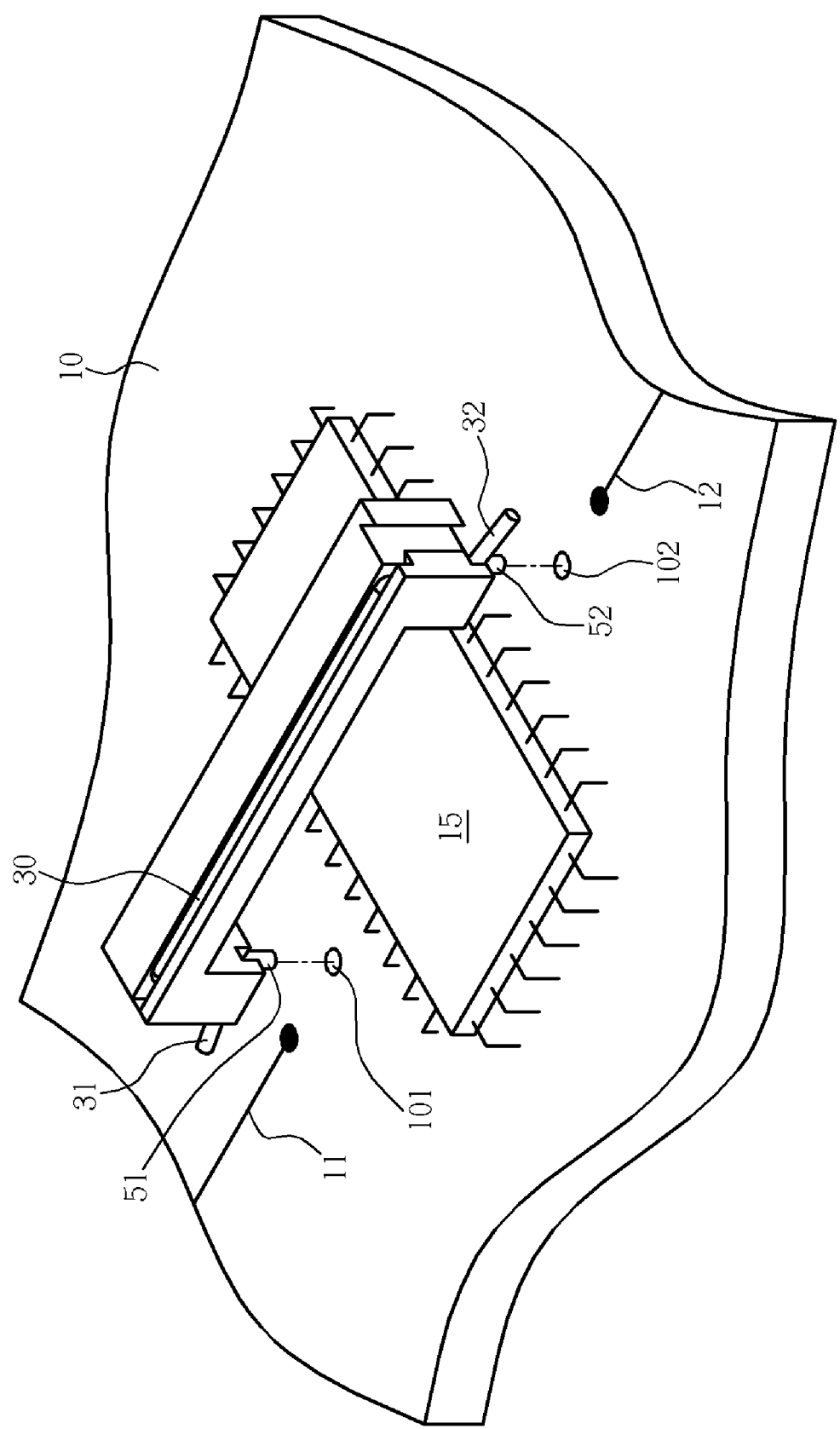
FIG. 5 is an illustration of the jumper wire holder plus the jumper wire installed on the PCB.

Please refer to FIG. 5. The jumper wire holder 50 of the present invention provides the jumper wire 30 with the supporting stability. A first end 31 of the jumper wire 30 is coupled with the first circuit end 11 of the PCB 10 and a second end 32 of the jumper wire 30 is coupled with the second circuit end 12 of the PCB 10 while the jumper wire 30 is fixed in the jumper wire holder 50 along the groove 53 and the jumper wire holder 50 is installed on the PCB 10. The first end 31 of the jumper wire 30 passes through a first holding hole 61 at one end of the jumper wire holder 50 and extends out of the jumper wire holder 50 along the first guider 71. The second end 32 of the jumper wire 30 passes through a second holding hole 62 at the other end of the jumper wire holder 50 and extends out of the jumper wire holder 50 along the second guider 72. The jumper wire holder 50 as well as the jumper wire 30 fixed thereon are installed on the PCB 10 by positioning and plugging the first position pin 51 and the second position pin 52 in the first position hole 101 and the second position hole 102 on the PCB 10 respectively. In such way, the first end 31 of the jumper wire 30 can electrically connect with the first circuit end 11 and the second end 32 of the jumper wire 30 can electrically connect with the second circuit end 12 while the jumper wire holder 50 as well as the jumper wire 30 fixed thereon are installed on the PCB 10. As the jumper wire holder 50 is installed on the PCB 10, the first guider 71 and the second guider 72 allow the first end 31 and the second end 32 of the jumper wire 30 to pass between the jumper wire holder 50 and the PCB 10 so that the jumper wire holder 50 can be installed closed on the PCB 10.

In FIG. 5, the jumper wire holder 50 has a span bridge 54 for allowing the jumper wire holder 50 to stride across the circuit (or an electronic element 15 in FIG. 5) on the PCB 10 when installed on the PCB 10. The jumper wire 30 on the jumper wire holder 50 can stride across other circuit on the PCB 10 in a safe distance, for example, 2.5 mm that sparkover is not going to happen between the jumper wire 30 and other circuit on the PCB 10. Additionally, when the jumper wire holder 50 is installed on the PCB 10, the present invention can further allow the operator to weld the first end 31 of the jumper wire 30 with the first circuit end 11 and to weld the second end 32 of the jumper wire 30 with the second circuit end 12 by reflow welding.

Figure 6:
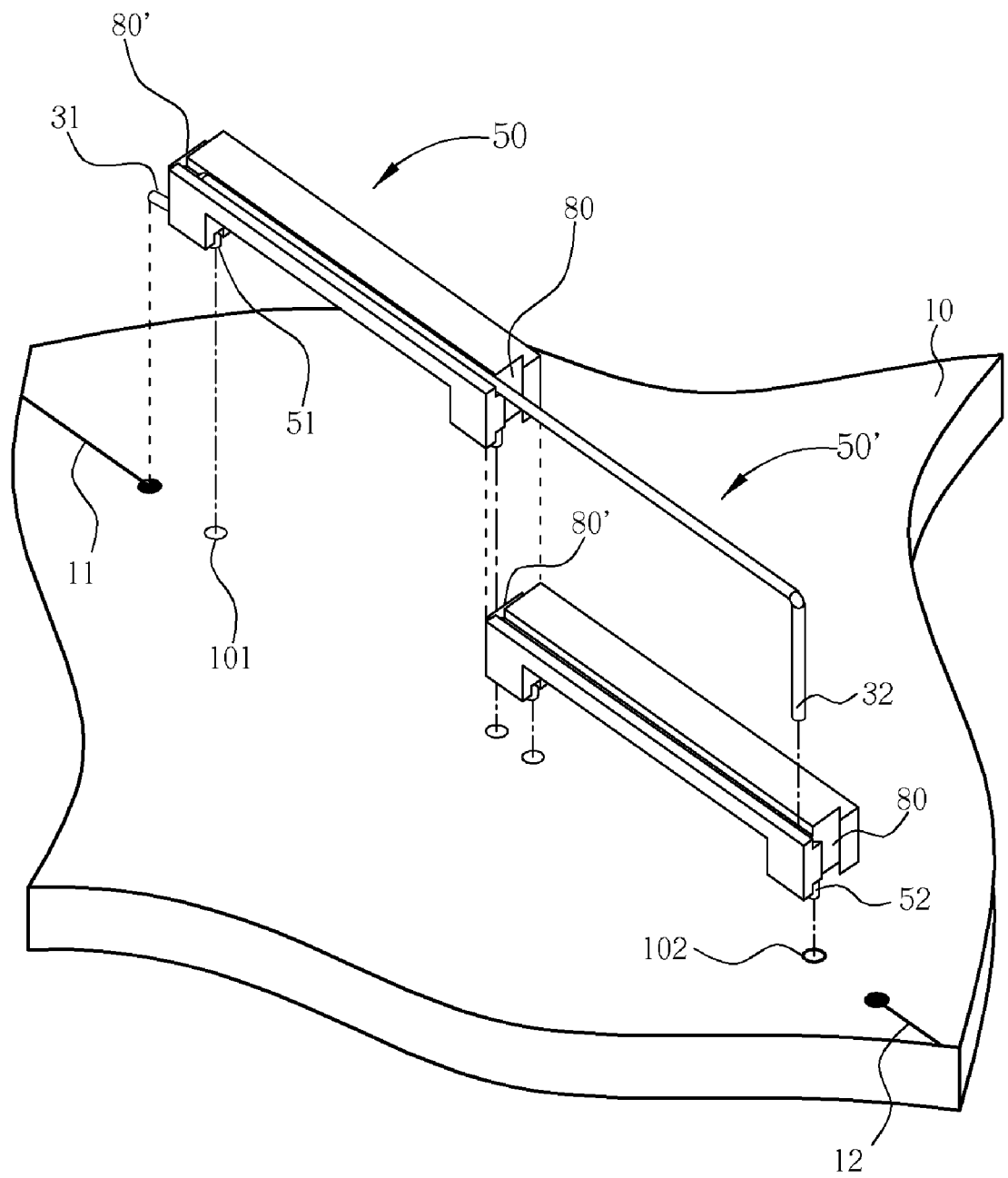
FIG. 6 is an illustration of the jumper wire holders combining in series.
Figure 7:
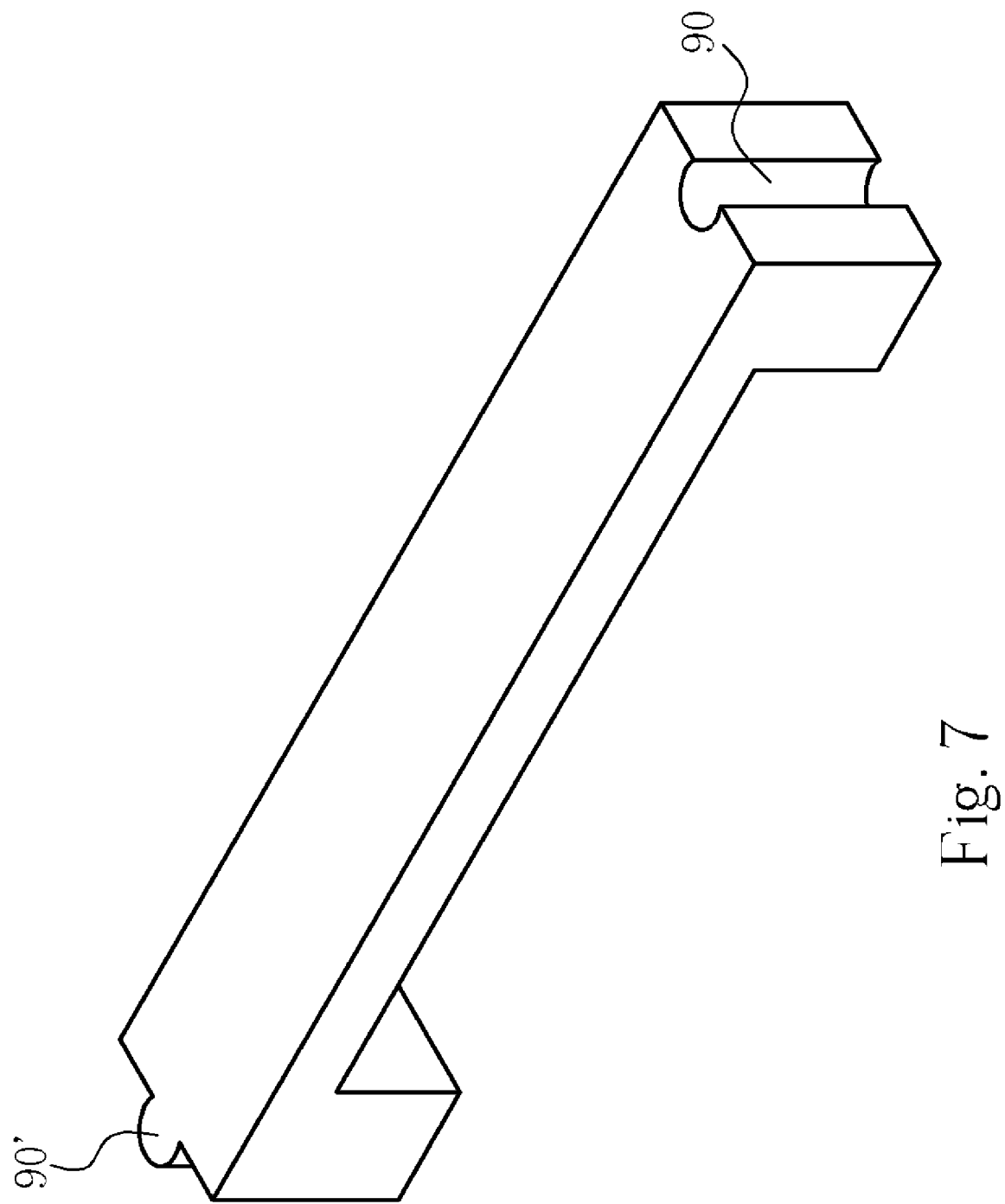
FIG. 7 is an illustration of a second type of the connectors of the jumper wire holder.

Please refer to FIG. 6. A male connector 80' and a female connector 80 are disposed at two ends of the jumper wire holder 50 respectively. The connectors can be wedge-shaped (like the connectors 80,80' in FIG. 3 to FIG. 6) or cylindrical (like the connectors 90,90' in FIG. 7). The connectors 80,80' (or connectors 90,90') allow the jumper wire holder 50 to combine with another jumper wire holder 50' (or even more jumper wire holder) in series when a longer jumper wire 30 is to be fixed thereon. As FIG. 6 shows, a female connector 80 of the jumper wire holder 50 is engaged with a male connector 80' of the jumper wire holder 50' so that the first end 31 of the jumper wire 30 passes through the first holding hole 61 of the jumper wire holder 50 and electrically connects with the first circuit end 11 and the second end 32 of the jumper wire 30 passes through the second holding hole 62 of the jumper wire holder 50' and electrically connects with the second circuit end 12 while the first position pin 51 of the jumper wire holder 50 plugs in the first position hole 101 and the second position pin 52 plugs in the second position hole 102 to complete positioning the serially combined jumper wire holders 50,50' on the PCB 10.

Figure 8:
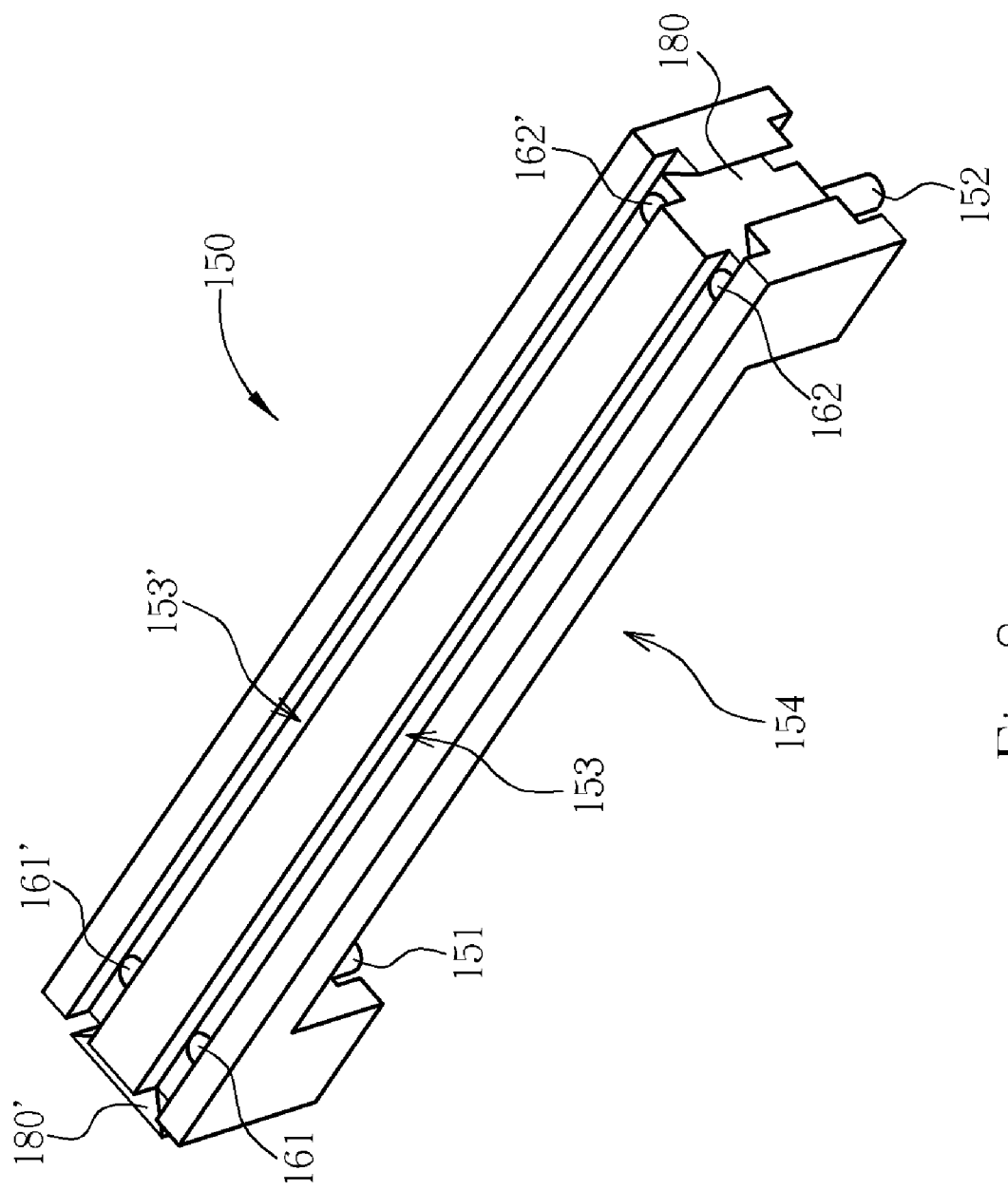
FIG. 8 is an illustration of a second exemplary embodiment of the jumper wire holder according to the present invention.

Please refer to FIG. 8. In addition to how the jumper wire holders 50,50' are combined in series, a second exemplary embodiment according to the present invention provides a plurality of grooves 153,153' to accomplish multiple jumper wire 30 holding structure. In FIG. 8, each of the plurality of jumper wires 30 (not shown in the figure) has its two ends pass through the first holding holes 161,161' and the second holding holes 162,162' and is fixed in the grooves 153 and 153' respectively. The jumper wire holder 150 is installed on the PCB 10 through the first position pin 151 and the second position pin 152. The connectors 180,180' also allow the jumper wire holder 150 to combine with another one in series.

The jumper wire holder disclosed in the present invention holds a jumper wire by fixing the jumper wire on a groove of the jumper wire holder when the first end of the jumper wire passes through the first holding hole of the jumper wire holder and the second end passes through a second holding hole of the jumper wire holder. The two positioning pins at the ends of the jumper wire holder allow the jumper wire holder for being easily installed on the PCB. The reflowing welding is available to weld the jumper wire on the jumper wire holder with the circuit on the PCB. The connectors at the ends of the jumper wire holder allow the jumper wire holder to combine in series, providing the jumper wire holder for holding longer jumper wire. The jumper wire holder of the present invention solves the problems that a prior art jumper wire is easily to deform, tilt, or crack at the contacts.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device having a combinational jumper wire holder, comprising:
   a printed circuit board (PCB) comprising a first position hole, a second position hole, a first circuit end, and a second circuit end;
   a jumper wire having a first end coupled with the first circuit end, a second end coupled with the second circuit end; and
   a jumper wire holder installed on the PCB, the jumper wire holder comprising:
      a plurality of position pins disposed at the ends of the jumper wire holder for plugging into the first position hole and the second position hole;
      a groove, the jumper wire fixed on the jumper wire holder along the groove;
      a plurality of holding holes, the first end and the second end of the jumper wire passing through one of the plurality of holding holes respectively for fixing the jumper wire in the groove; and
      a plurality of guiders disposed at the ends of the jumper wire holder, the first end and the second end of the jumper wire passing through one of the plurality of guiders and coupled with the first circuit end and the second circuit end respectively.

2. The electronic device of claim 1 wherein the jumper wire holder further comprising a span bridge for providing room for an electronic element on the PCB.

3. The electronic device of claim 1 wherein the jumper wire holder further comprising a connector for combining a second jumper holder on the PCB in series.

4. The electronic device of claim 3 wherein the connector is wedge-shaped.

5. The electronic device of claim 3 wherein the connector is cylindrical.

6. A combinational jumper wire holder installed on a printed circuit board (PCB), the PCB comprising a first circuit end, a second circuit end, and a jumper wire, the jumper wire coupled with the first circuit end and the second circuit end, the combinational jumper wire holder comprising:
   a plurality of position pins disposed at two ends of the jumper wire holder for plugging into position holes on the PCB;
   a groove, the jumper wire fixed on the jumper wire holder along the groove;
   a plurality of holding holes, the ends of the jumper wire passing through one of the plurality of holding holes respectively for fixing the jumper wire in the groove; and
   a plurality of guiders disposed at the ends of the jumper wire holder, the ends of the jumper wire passing through one of the plurality of guiders and coupled with the first circuit end and the second circuit end respectively.

7. The jumper wire holder of claim 6, further comprising a span bridge for providing room for an electronic element on the PCB.

8. The jumper wire holder of claim 6, further comprising a connector for combining a second jumper holder on the PCB in series.

9. The jumper wire holder of claim 8 wherein the connector is wedge-shaped.

10. The jumper wire holder of claim 8 wherein the connector is cylindrical.

\* \* \* \* \*